United States Patent
Arai

(10) Patent No.: US 10,380,016 B2
(45) Date of Patent: Aug. 13, 2019

(54) SEMICONDUCTOR DEVICE INCLUDING ONE OR MORE SEMICONDUCTOR CHIPS ON A SUBSTRATE

(71) Applicant: TOSHIBA MEMORY CORPORATION, Minato-Ku, Tokyo (JP)

(72) Inventor: Toshimitsu Arai, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/696,983

(22) Filed: Sep. 6, 2017

(65) Prior Publication Data

US 2018/0253375 A1  Sep. 6, 2018

(30) Foreign Application Priority Data

Mar. 1, 2017 (JP) .................. 2017-038715

(51) Int. Cl.
| | |
|---|---|
| *G11C 8/00* | (2006.01) |
| *G06F 12/02* | (2006.01) |
| *H01L 25/065* | (2006.01) |
| *H01L 23/00* | (2006.01) |
| *H01L 25/03* | (2006.01) |
| *H01L 25/18* | (2006.01) |
| *H01L 21/52* | (2006.01) |
| *G11C 16/10* | (2006.01) |
| *H01L 23/31* | (2006.01) |

(52) U.S. Cl.
CPC .......... *G06F 12/0246* (2013.01); *G11C 16/10* (2013.01); *H01L 21/52* (2013.01); *H01L 24/73* (2013.01); *H01L 25/03* (2013.01); *H01L 25/0652* (2013.01); *H01L 25/0657* (2013.01); *H01L 25/18* (2013.01); *H01L 23/3128* (2013.01); *H01L 2224/32145* (2013.01); *H01L 2224/73265* (2013.01)

(58) Field of Classification Search
CPC ..... G06F 12/0246; H01L 24/73; H01L 21/52; H01L 25/0657; H01L 25/0652; H01L 25/03; H01L 25/18; G11C 16/10
USPC ..................................... 365/230.01
See application file for complete search history.

(56) References Cited

U.S. PATENT DOCUMENTS

| | | | | |
|---|---|---|---|---|
| 5,247,423 A | * | 9/1993 | Lin ........................ | H05K 1/144 174/252 |
| 5,467,253 A | * | 11/1995 | Heckman ................ | H01L 23/04 174/260 |
| 5,629,559 A | * | 5/1997 | Miyahara .............. | H01L 23/057 257/666 |

(Continued)

FOREIGN PATENT DOCUMENTS

| | | |
|---|---|---|
| JP | 2008103531 A | 5/2008 |
| JP | 5005534 B2 | 8/2012 |
| JP | 2015216219 A | 12/2015 |

*Primary Examiner* — Tha-O H Bui
(74) *Attorney, Agent, or Firm* — Holtz, Holtz & Volek PC

(57) ABSTRACT

In one embodiment, a semiconductor device includes a substrate, and a first wiring layer provided on the substrate. The device further includes a first insulator provided on the substrate and the first wiring layer and including an opening. The device further includes a first semiconductor chip provided above the substrate and in the opening of the first insulator, and a wire electrically connecting the first semiconductor chip and the first wiring layer.

18 Claims, 6 Drawing Sheets

(56) References Cited

U.S. PATENT DOCUMENTS 7,692,279 B2     4/2010   Karnezos et al.
8,923,004 B2 *   12/2014   Low ..................... H01L 21/565
                                                           361/760

* cited by examiner

US 10,380,016 B2

SEMICONDUCTOR DEVICE INCLUDING ONE OR MORE SEMICONDUCTOR CHIPS ON A SUBSTRATE

CROSS REFERENCE TO RELATED APPLICATION

This application is based upon and claims the benefit of priority from the prior Japanese Patent Application No. 2017-038715, filed on Mar. 1, 2017, the entire contents of which are incorporated herein by reference.

FIELD

Embodiments described herein relate generally to a semiconductor device.

BACKGROUND

Development of MCP (Multi Chip Package) has been recently advanced. The MCP includes plural semiconductor chips in one semiconductor package. In this case, when a smaller-sized first semiconductor chip is stacked on a larger-sized second semiconductor chip, wire bonding for the first semiconductor chip may be difficult. Therefore, it can be considered that the larger-sized second semiconductor chip is stacked on the smaller-sized first semiconductor chip via an adhesive called an FOD (Film on Die), so that the smaller-sized first semiconductor chip is embedded in the FOD.

In this case, the upper face of the FOD on the first semiconductor chip may swell due to the influence of the thickness of the first semiconductor chip. As a result, pressure may be exerted on the second semiconductor chip, and the upper face of the second semiconductor chip may swell. When a third semiconductor chip is stacked on such a second semiconductor chip, a crack originating from this swelling can arise in a semiconductor package. Moreover, regarding a sealing resin that covers these semiconductor chips, since a portion of the sealing resin above this swelling becomes thin, laser may penetrate this portion in laser marking to damage the semiconductor chip(s). Therefore, the sealing resin is needed to be thicker, which prevents the semiconductor package from being thinner. Therefore, in order to solve these problems, there is a need for a technique of mounting a semiconductor chip on a substrate and stacking plural semiconductor chips in a preferable state.

DETAILED DESCRIPTION

Embodiments will now be explained with reference to the accompanying drawings.

In one embodiment, a semiconductor device includes a substrate, and a first wiring layer provided on the substrate. The device further includes a first insulator provided on the substrate and the first wiring layer and including an opening. The device further includes a first semiconductor chip provided above the substrate and in the opening of the first insulator, and a wire electrically connecting the first semiconductor chip and the first wiring layer.

First Embodiment

Figure 1A:
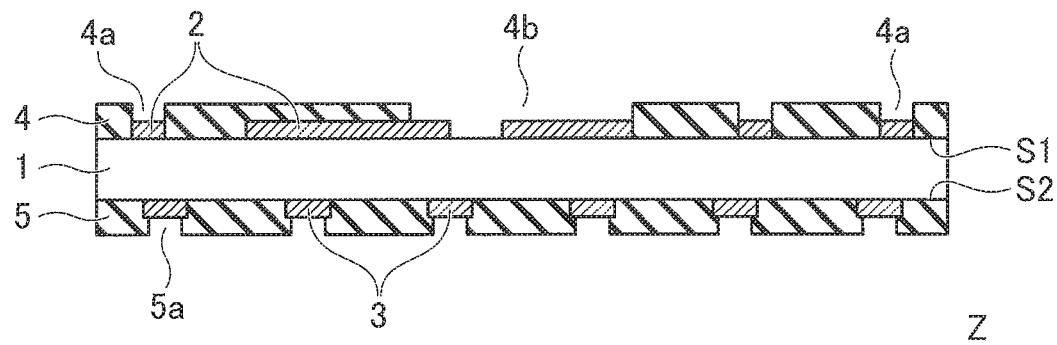
FIGS. 1A to 2B are cross-sectional views and top views showing a method of manufacturing a semiconductor device of a first embodiment.
Figure 3:
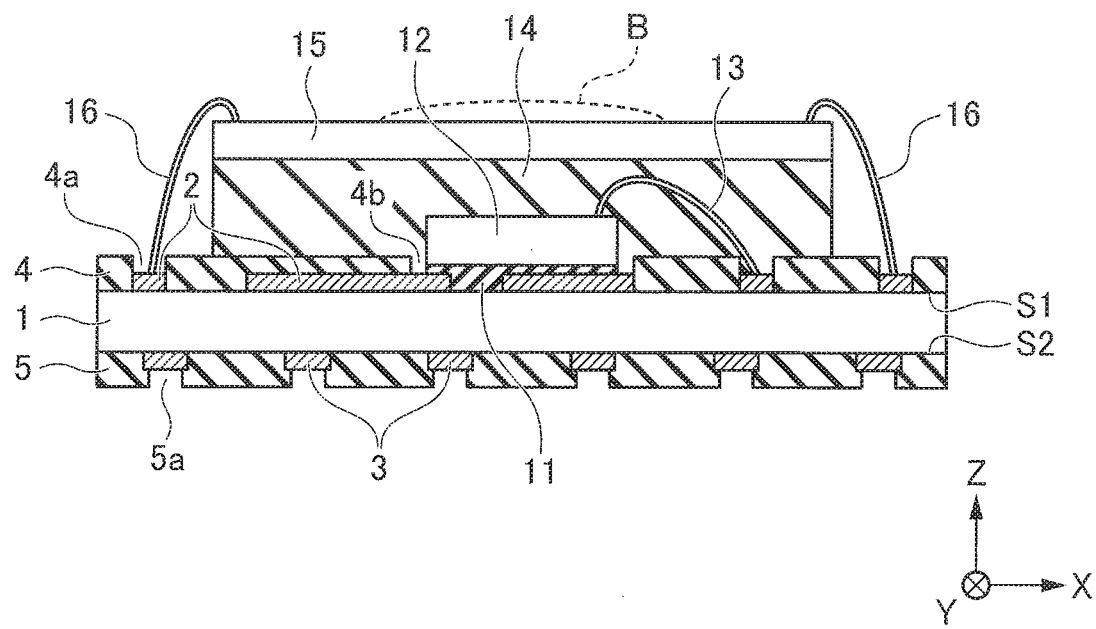
FIGS. 3 and 4 are cross-sectional views showing the method of manufacturing the semiconductor device of the first embodiment.
Figure 4:
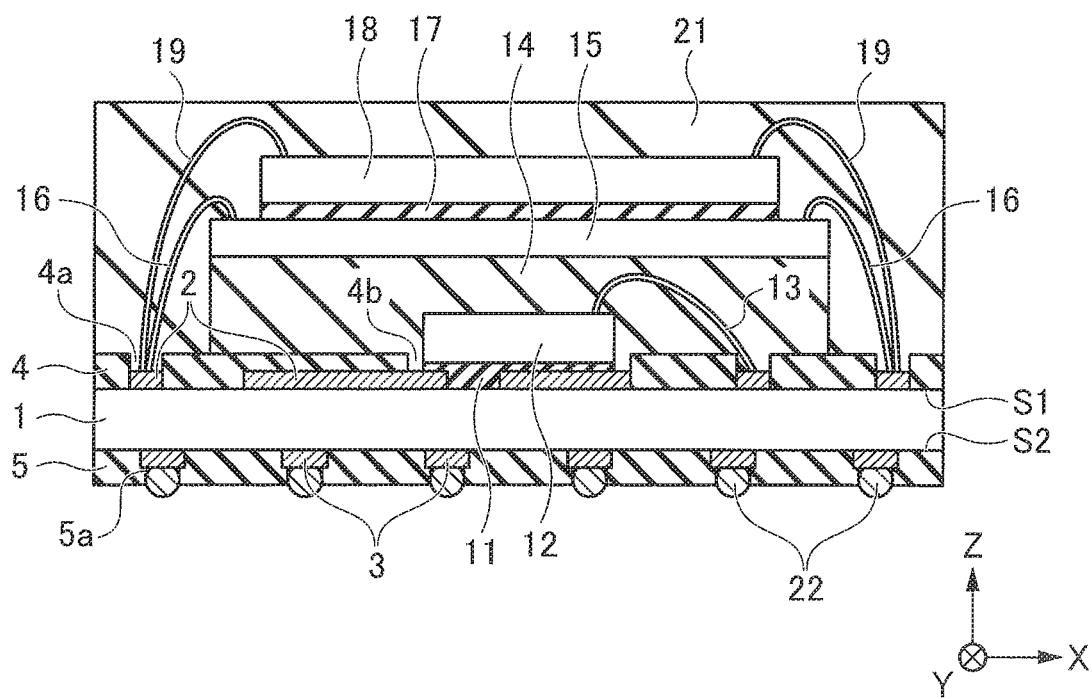

FIGS. 1A to 2B are cross-sectional views and top views showing a method of manufacturing a semiconductor device of a first embodiment. FIG. 1A shows a cross-section taken along a line A-A' in FIG. 1B. FIG. 2A show a cross-section taken along the line A-A' in FIG. 2B. FIGS. 3 and 4 are cross-sectional views showing the method of manufacturing the semiconductor device of the first embodiment.

Figure 1B:
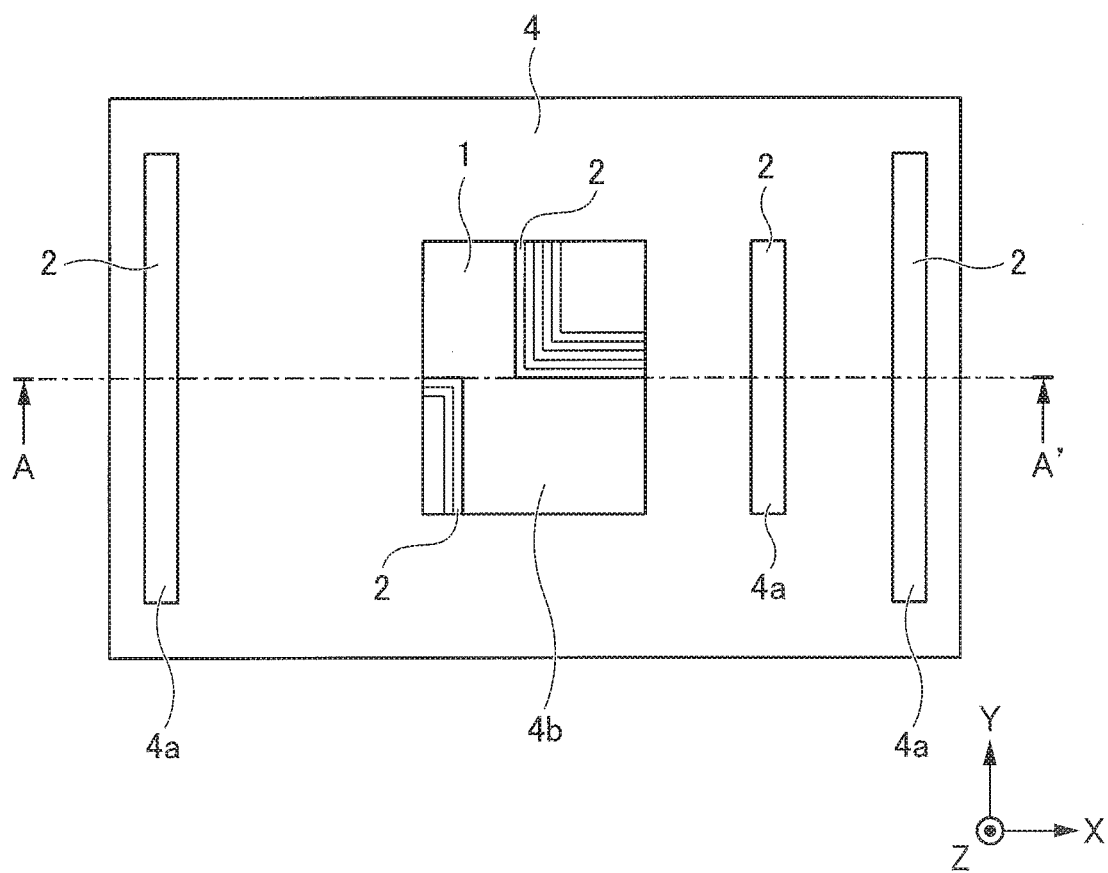

First, a substrate 1 as shown in FIGS. 1A and 1B is prepared. FIGS. 1A and 1B show an X-direction and a Y-direction which are parallel to first and second faces S1 and S2 of the substrate 1 and perpendicular to each other, and a Z-direction which is perpendicular to the first and second faces S1 and S2 of the substrate 1. The first face S1 corresponds to a front face of the substrate 1. The second face S2 corresponds to a rear face of the substrate 1. In this specification, the +Z-direction is regarded as the upward direction, and the −Z-direction is regarded as the downward direction. The −Z-direction may be coincide with the direction of gravity or may not coincide therewith.

FIGS. 1A and 1B show the substrate 1, a first wiring layer 2, a second wiring layer 3, a first solder resist 4 which is an example of a first insulator, and a second solder resist 5 which is an example of a second insulator.

The first wiring layer 2 is formed on the first face S1 of the substrate 1. An example of the first wiring layer 2 is a metal layer such as a copper (Cu) layer. The thickness of the first wiring layer 2 of the present embodiment is 12 μm.

The second wiring layer 3 is formed on the second face S2 of the substrate 1. An example of the second wiring layer 3 is a metal layer such as a copper (Cu) layer. The thickness of the second wiring layer 3 of the present embodiment is 12 μm.

The first solder resist 4 is a resin film for protecting the first wiring layer 2, and is formed on the first face S1 so as to cover the substrate 1 and the first wiring layer 2. The thickness of the first solder resist 4 of the present embodiment is, as a measurement from the first face S1 of the substrate 1, 30 μm, and is, as a measurement from the upper face of the first wiring layer 2, 18 μm. Namely, the total film thickness of the first wiring layer 2 and the first solder resist 4 is 30 μm.

The first solder resist 4 has openings 4a and 4b. The openings 4a are provided for using parts of the first wiring layer 2 as pads. The opening 4b is provided for containing a semiconductor chip as mentioned later. While in FIG. 1B, the first wiring layer 2 (routing wirings) exists in the opening 4b, the first wiring layer 2 may not exist in the opening 4b.

The second solder resist 5 is a resin film for protecting the second wiring layer 3, and is formed on the second face S2 so as to cover the substrate 1 and the second wiring layer 3. The thickness of the second solder resist 5 of the present embodiment is, as a measurement from the second face S2 of the substrate 1, 30 μm, and is, as a measurement from the lower face of the second wiring layer 3, 18 μm. Namely, the total film thickness of the second wiring layer 3 and the second solder resist 5 is 30 μm.

The second solder resist 5 has openings 5a. The openings 5a are provided for using parts of the second wiring layer 3 as pads.

Figure 2A:
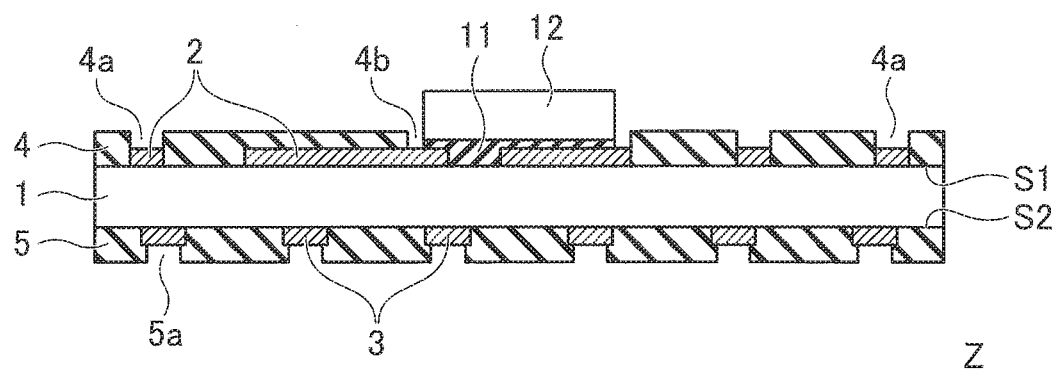
Figure 2B:
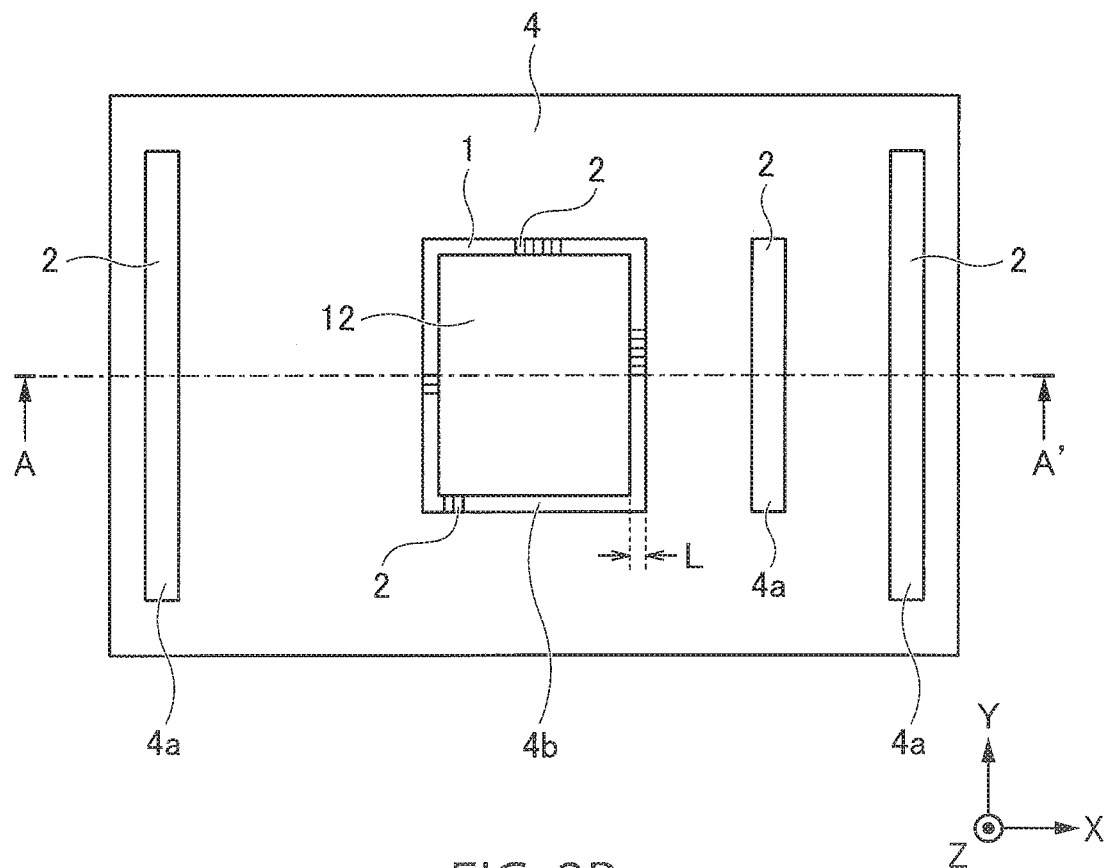

Next, as shown in FIGS. 2A and 2B, a first semiconductor chip 12 is mounted on the first face S1 of the substrate 1 via a first adhesive 11. Specifically, on the substrate 1, the first semiconductor chip 12 is disposed in the opening 4b of the first solder resist 4, and bonded to the substrate 1.

The material of the first adhesive 11 may be film-like or liquid. The first adhesive 11 of the present embodiment is, for example, a DAF (Die Attachment Film). The thickness of the first adhesive 11 of the present embodiment is, as a measurement from the first face S1 of the substrate 1, 15 μm. The thickness of the first adhesive 11 is set to be larger than the thickness of the first wiring layer 2 such that the first wiring layer 2 does not come into contact with the first semiconductor chip 12. Moreover, in order to make a semiconductor package be a thin film, the thickness of the first adhesive 11 is set to be smaller than the total film thickness of the first wiring layer 2 and the first solder resist.

The first semiconductor chip 12 is, for example, a controller for controlling a memory. As shown in FIG. 2B, the first semiconductor chip 12 of the present embodiment is disposed in the opening 4b of the first solder resist 4 so as to avoid contact with the first solder resist 4. The size of the opening 4b may be set to be any size as long as the first solder resist 4 does not overlap with the first semiconductor chip 12.

Sign L designates the width of a gap between the first solder resist 4 and the first semiconductor chip 12. In order to secure a margin in disposing the first semiconductor chip 12, the width L of the gap is desirably set, for example, to be 10 μm or more. Moreover, the thickness of the first semiconductor chip 12 is, for example, 30 μm.

Since the first wiring layer 2 exists in the opening 4b, the first semiconductor chip 12 is mounted on the substrate 1 and the first wiring layer 2 via the first adhesive 11. On the other hand, when the first wiring layer 2 does not exist in the opening 4b, the first semiconductor chip 12 is mounted on the substrate 1 via the first adhesive 11 and not to sandwich the first wiring layer 2 between the substrate 1 and the first semiconductor chip 12.

Next, the first semiconductor chip 12 is electrically connected to the first wiring layer 2 in the opening 4a with a first bonding wire 13 (FIG. 3). Next, a second semiconductor chip 15 on which a second adhesive 14 is pasted is mounted on the first semiconductor chip 12 (FIG. 3). Next, the second semiconductor chip 15 is electrically connected to the first wiring layer 2 in the openings 4a with second bonding wires 16 (FIG. 3).

The material of the second adhesive 14 may be film-like or liquid as long as the first semiconductor chip 12 and the first bonding wire 13 can be embedded therein. The second adhesive 14 of the present embodiment corresponds to an FOD (Film on Die).

The second semiconductor chip 15 is, for example, a NAND memory or an SDRAM (Synchronous Dynamic Random Access Memory). The thickness of the second semiconductor chip 15 is, for example, 30 μm. Moreover, the second semiconductor chip 15 of the present embodiment has a larger size than that of the first semiconductor chip 12. Here, the sizes of the first and second semiconductor chips 12 and 15 mean the areas of the upper faces or the lower faces of these semiconductor chips. The same holds true for other semiconductor chips mentioned later.

Since the second semiconductor chip 15 has a larger size than that of the first semiconductor chip 12 as above, the first semiconductor chip 12 and the first bonding wire 13 are to be embedded in the second adhesive 14.

Next, a third semiconductor chip 18 is mounted on the second semiconductor chip 15 via a third adhesive 17 (FIG. 4). Next, the third semiconductor chip 18 is electrically connected to the first wiring layer 2 in the openings 4a with third bonding wires 19 (FIG. 4).

The material of the third adhesive 17 may be film-like or liquid. The third adhesive 17 of the present embodiment is, for example, a DAF.

The third semiconductor chip 18 is, for example, a NAND memory or an SDRAM. The thickness of the third semiconductor chip 18 is, for example, 30 μm. While the third semiconductor chip 18 here has a smaller size than that of the second semiconductor chip 15, it may have a larger size than that of the second semiconductor chip 15, or may have the same size as that of the second semiconductor chip 15.

After that, a sealing resin 21 is formed on the first face S1 of the substrate 1 so as to cover the first to third semiconductor chips 12, 15 and 18 and the like to perform laser marking onto the upper face of the sealing resin 21 (FIG. 4). Furthermore, solder balls 22 are provided on the second wiring layer 3 in the openings 5a (FIG. 4). In this way, a semiconductor device (semiconductor package) of the present embodiment is manufactured.

The semiconductor device of the present embodiment may be configured to have four or more semiconductor chips stacked. In this case, one or more semiconductor chips are further stacked on the third semiconductor chip 18. Moreover, the semiconductor device of the present embodiment may include two or more first semiconductor chips 12 on the first face S1 of the substrate 1.

Next, referring FIG. 3 again, a swelling B on the upper face of the second semiconductor chip 15 is described.

In the present embodiment, the large-sized second semiconductor chip 15 is stacked on the small-sized first semiconductor chip 12 with the second adhesive 14 to embed the first semiconductor chip 12 in the second adhesive 14. Therefore, the upper face of the second adhesive 14 on the first semiconductor chip 12 may swell due to the influence of the thickness of the first semiconductor chip 12. As a result, pressure may be exerted on the second semiconductor chip 15, and the upper face of the second semiconductor chip may swell. FIG. 3 schematically shows such occurrence of a swelling B.

From some investigation, it was found that the height (thickness) of the swelling B was linearly reduced as the height of the upper face of the first semiconductor chip 12 relative to the first face S1 was reduced. Therefore, the first semiconductor chip 12 of the present embodiment is disposed in the opening 4b of the first solder resist 4, not on the first solder resist 4. In this way, the height of the upper face of the first semiconductor chip 12 can be reduced, and the height of the swelling B can be reduced.

For example, when the first semiconductor chip 12 is disposed on the first solder resist 4, the height of the upper face of the first semiconductor chip 12 relative to the first face S1 is 75 μm, and the upper face of the first semiconductor chip 12 is higher than the upper face of the first solder resist 4 by 45 μm. It was found that in this case, the height of the swelling B was 60 μm.

On the other hand, when the first semiconductor chip 12 is disposed in the opening 4b of the first solder resist 4, the height of the upper face of the first semiconductor chip 12 relative to the first face S1 is 45 μm, and the upper face of the first semiconductor chip 12 is higher than the upper face of the first solder resist 4 by 15 µm. It was found that in this case, the height of the swelling B was 37 µm.

Therefore, the first semiconductor chip 12 of the present embodiment is disposed not on the first solder resist 4 but in the opening 4b of the first solder resist 4, and thereby, the height of the swelling B can be reduced from 60 µm to 37 µm by 23 µm. With approximately 30 µm of thickness of the second semiconductor chip 15 taken into consideration, the effect that the height of the swelling B is reduced by 23 µm is remarkable. In this way, there can be reduced a possibility that a crack originating from the swelling B arises in the semiconductor package. Such a crack tends to arise after stacking of the third semiconductor chip 18 or in a temperature cycle test of the semiconductor chip, and according to the present embodiment, such occurrence of a crack can be suppressed.

Moreover, by reducing the height of the swelling B, the sealing resin 21 in a portion above the swelling B can be made thicker. Specifically, above the swelling B, the distance between the upper face of the sealing resin 21 and the upper face of the topmost semiconductor chip (herein, the third semiconductor chip 18) can be made longer. In this way, even when the sealing resin 21 is thin, there can be reduced a possibility that laser damages the topmost semiconductor chip in laser marking, which can improve yields of semiconductor devices and make a semiconductor package be a thin film.

Figure 5A:
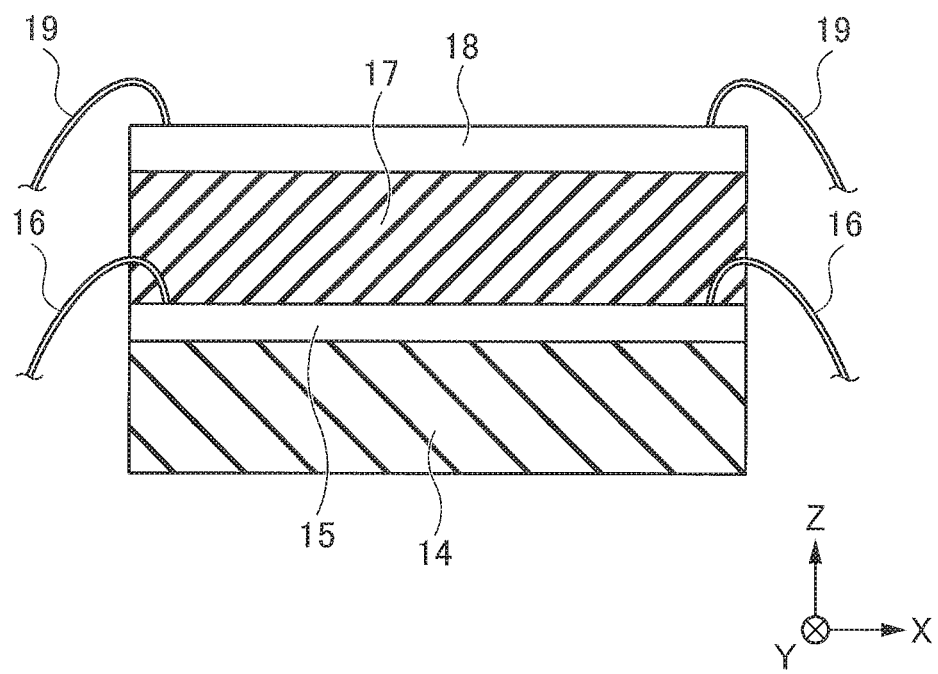
FIGS. 5A and 5B are cross-sectional views showing methods of manufacturing semiconductor devices according to modifications of the first embodiment.
Figure 5B:
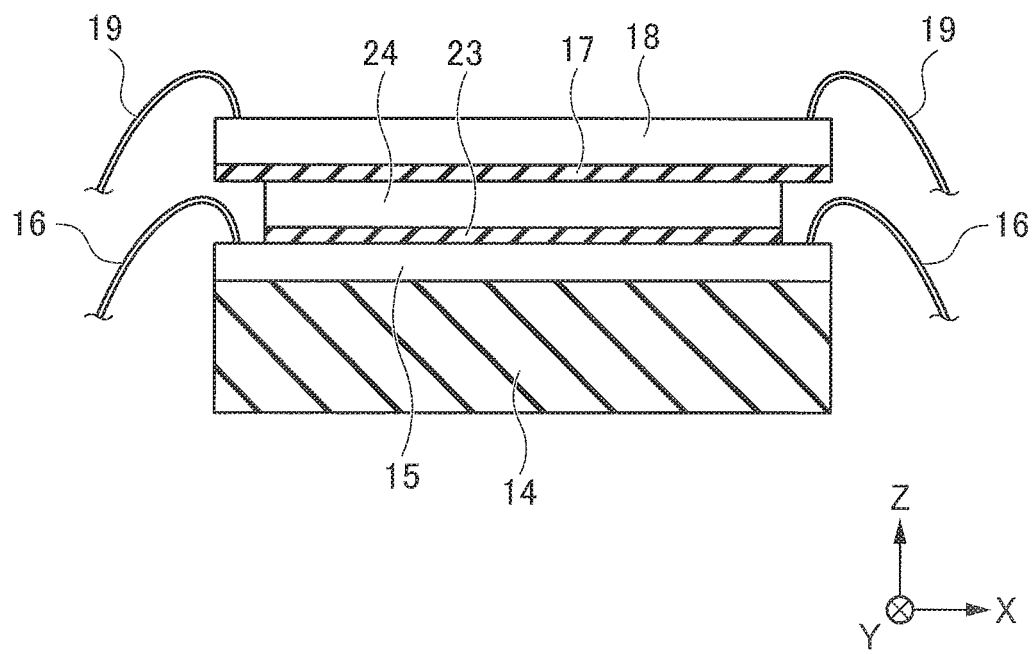

FIGS. 5A and 5B are cross-sectional views showing methods of manufacturing semiconductor devices according to modifications of the first embodiment.

The third semiconductor chip 18 shown in FIG. 5A has the same size as that of the second semiconductor chip 15. In this case, when the third semiconductor chip 18 is stacked on the second semiconductor chip 15 via a DAF, the second bonding wire 16 possibly prevents stacking.

Therefore, in the present modification, an FOD is used as the third adhesive 17. The third semiconductor chip 18 on which an FOD is pasted is mounted on the second semiconductor chip 15. In this way, the second bonding wire 16 is partially embedded in this FOD, which can relieve the aforementioned problem of hindrance.

The third semiconductor chip 18 shown in FIG. 5B also has the same size as that of the second semiconductor chip 15. Therefore, in this modification, a dummy chip 24 is stacked on the second semiconductor chip 15 via an adhesive (DAF) 23, and the third semiconductor chip 18 is stacked on the dummy chip 24 via the third adhesive 17.

The dummy chip 24 is a semiconductor member that does not function as a semiconductor chip such as a memory, and is, for example, a silicon member. The dummy chip 24 of the present embodiment has a smaller size than those of the second and third semiconductor chips 15 and 18. Therefore, the aforementioned problem of hindrance can be relieved without the second bonding wire 16 embedded in the third adhesive 17.

Figure 6A:
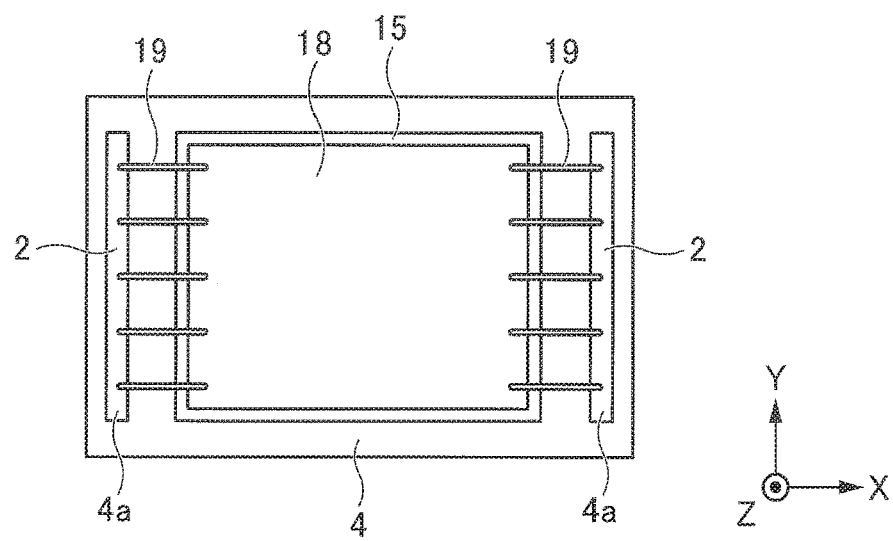
FIGS. 6A to 6C are top views for exemplarily explaining shapes and arrangements of a second semiconductor chip and a third semiconductor chip of the first embodiment.
Figure 6B:
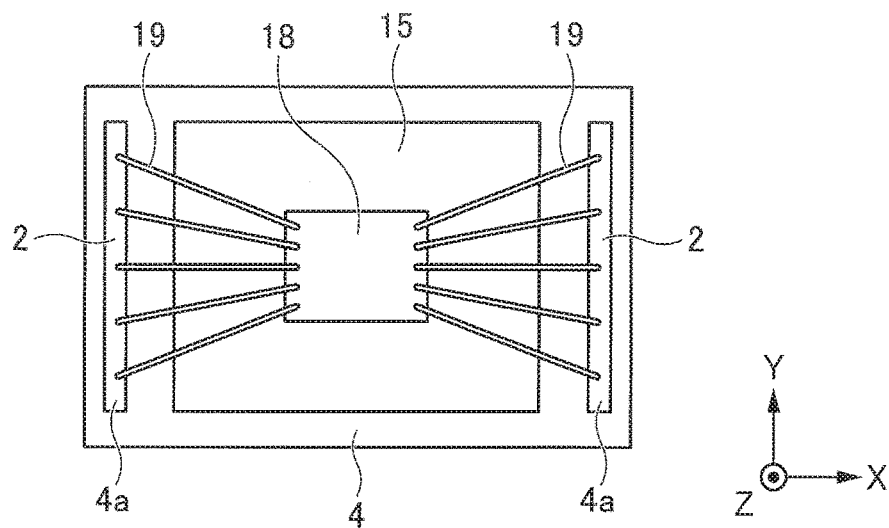
Figure 6C:
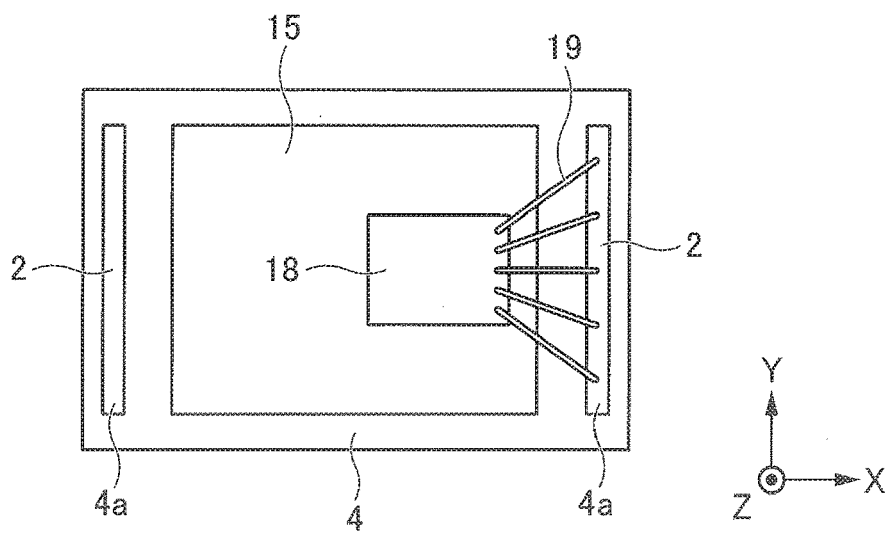

FIGS. 6A to 6C are top views for exemplarily explaining shapes and arrangements of the second semiconductor chip 15 and the third semiconductor chip 18 of the first embodiment.

FIG. 6A shows a state where the third semiconductor chip 18 is stacked on the second semiconductor chip 15, and the third semiconductor chip 18 and the first wiring layer 2 in the openings 4a are connected with the third bonding wires 19. Since the size of the second semiconductor chip 15 is large, these openings 4a are needed to be disposed close to end parts of the substrate 1. The reason is that if these openings 4a were separate from the end parts of the substrate 1, these openings 4a would be covered by the second semiconductor chip 15.

FIG. 6B shows an example in which the size of the third semiconductor chip 18 is made smaller. In this case, since the distance between the third semiconductor chip 18 and the openings 4a in FIG. 6B becomes longer, connection with the third bonding wires 19 becomes difficult.

Therefore, it is desirable that the third semiconductor chip 18 in this case is disposed close to any of these openings 4a (FIG. 6C). In this way, even when the size of the third semiconductor chip 18 is small, connection with the third bonding wires 19 can be easily performed.

The same holds true for the first semiconductor chip 12. In the present embodiment, the opening 4a is provided also close to the opening 4b, and this opening 4a is used for connection with the first bonding wire 13 (see FIG. 1B, FIG. 2B, FIG. 3 and the like). In this way, connection with the first bonding wire 13 can be easily performed.

Figure 7A:
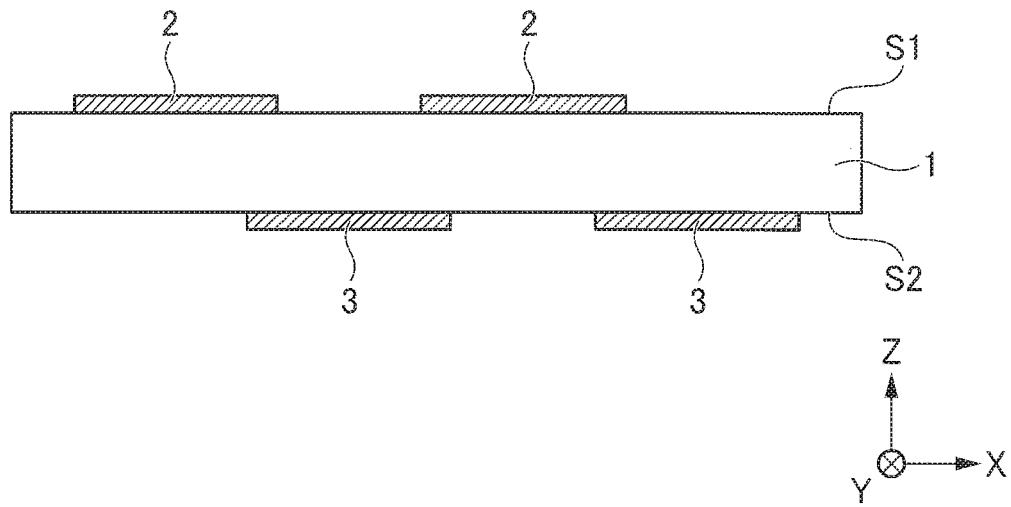
FIGS. 7A and 7B are cross-sectional views for exemplarily explaining structures of a substrate of the first embodiment.
Figure 7B:
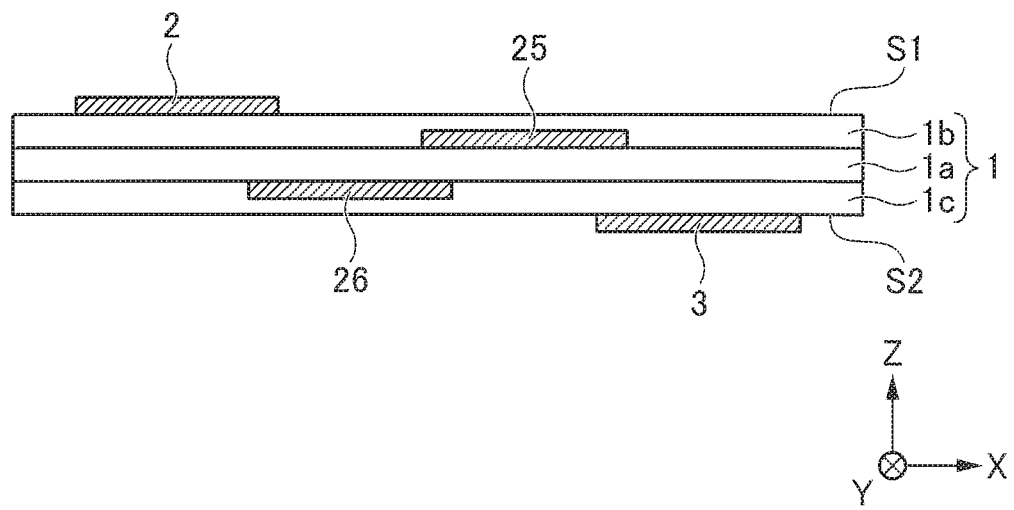

FIGS. 7A and 7B are cross-sectional views for exemplarily explaining structures of the substrate 1 of the first embodiment.

The substrate 1 shown in FIG. 7A is a double-layered substrate in which the first wiring layer 2 is provided on the first face S1 of the substrate 1 and the second wiring layer 3 is provided on the second face S2 of the substrate 1. The first wiring layer 2 and the second wiring layer 3 are electrically connected to each other, for example, through via plugs penetrating the substrate 1.

The substrate 1 shown in FIG. 7B is a multilayered substrate in which one or more wiring layers are provided in the substrate 1 in addition to the first and second wiring layers 2 and 3. As an example of such wiring layers, FIG. 7B shows third and fourth wiring layers 25 and 26. The third wiring layer 25 is provided between a first layer 1a and a second layer 1b of the substrate 1. The fourth wiring layer 26 is provided between the first layer 1a and a third layer 1c of the substrate 1. The first to fourth wiring layers 2, 3, 25 and 26 are electrically connected to one another, for example, through via plugs provided in the substrate 1.

The substrate 1 of the present embodiment may have the structure shown in FIG. 7A or may have the structure shown in FIG. 7B.

As described above, the first semiconductor chip 12 of the present embodiment is disposed in the opening 4a of the first solder resist 4. Therefore, according to the present embodiment, as compared with the case where the first semiconductor chip 12 is disposed on the first solder resist 4, a semiconductor package can be made a thin film, or the distance between the upper face of the sealing resin 21 and the upper face of the topmost semiconductor chip can be sufficiently secured.

Moreover, in the present embodiment, the second semiconductor chip 15 larger in size than the first semiconductor chip 12 is disposed on the first semiconductor chip 12 via the second adhesive 14. Therefore, according to the present embodiment, a structure in which connection with first and second bonding wires 13 and 16 is easy can be realized. Furthermore, according to the present embodiment, the aforementioned problem of the swelling B can be handled while employing a structure in which the second semiconductor chip 15 is stacked on the first semiconductor chip 12.

Specifically, a possibility of a crack originating from the swelling B in a semiconductor package in the case where the third semiconductor chip 18 is stacked on the second semiconductor chip 15 can be reduced. Moreover, even when the sealing resin 21 is thin, a possibility that laser damages the topmost semiconductor chip in laser marking can be reduced.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a first wiring layer provided on the substrate;
a first insulator provided on the substrate and the first wiring layer and including an opening;
a first semiconductor chip provided above the substrate and in the opening of the first insulator;
a wire electrically connecting the first semiconductor chip and the first wiring layer; and
a second semiconductor chip provided above the first semiconductor chip via a second adhesive and having a size larger than a size of the first semiconductor chip, the first semiconductor chip being located in the second adhesive.

2. The device of claim 1, wherein the first semiconductor chip is provided in the opening of the first insulator so as to avoid contact with the first insulator.

3. The device of claim 1, wherein the first insulator is a solder resist covering the first wiring layer.

4. The device of claim 1, wherein a width of a gap between the first insulator and the first semiconductor chip is 10 µm or more.

5. The device of claim 1, wherein the first semiconductor chip is provided above the first wiring layer via a first adhesive.

6. The device of claim 1, wherein the first semiconductor chip is provided above the substrate so as not to sandwich the first wiring layer between the substrate and the first semiconductor chip.

7. The device of claim 6, wherein the first semiconductor chip is provided above the substrate via a first adhesive and so as not to sandwich the first wiring layer between the substrate and the first semiconductor chip.

8. The device of claim 5, wherein a thickness of the first adhesive is larger than a thickness of the first wiring layer.

9. The device of claim 5, wherein a thickness of the first adhesive is smaller than a total thickness of the first wiring layer and the first insulator.

10. The device of claim 1, wherein the substrate is a double-layered substrate in which the first wiring layer is provided on a first face of the substrate and a second wiring layer is provided on a second face of the substrate, or a multilayered substrate in which the first wiring layer is provided on the first face of the substrate, the second wiring layer is provided on the second face of the substrate, and one or more wiring layers are provided in the substrate.

11. The device of claim 1, wherein the second adhesive is an FOD (Film on Die).

12. The device of claim 1, wherein the wire is located in the second adhesive.

13. The device of claim 1, further comprising a third semiconductor chip provided above the second semiconductor chip.

14. The device of claim 13, wherein the third semiconductor chip is provided above the second semiconductor chip via a semiconductor member that does not function as a semiconductor chip.

15. The device of claim 13, wherein a wire that electrically connects the second semiconductor chip and the first wiring layer is entirely located outside the second adhesive.

16. The device of claim 13, wherein a wire that electrically connects the second semiconductor chip and the first wiring layer is partially located in the second adhesive.

17. The device of claim 1, wherein the substrate includes a first face provided with the first wiring layer, and a second face different from the first face,
the device further comprising:
a second wiring layer provided on the second face of the substrate;
a second insulator provided on the second face of the substrate and a face of the second wiring layer and including an opening; and
a solder ball provided on a face of the second wiring layer in the opening of the second insulator.

18. The device of claim 17, wherein the second insulator is a solder resist covering the second wiring layer.

* * * * *